United States Patent [19]

Robinson

[11] Patent Number: 4,689,607

[45] Date of Patent: Aug. 25, 1987

[54] BIDIRECTIONAL TRANSCONDUCTANCE AMPLIFIER

[75] Inventor: Jeffrey I. Robinson, New Fairfield, Conn.

[73] Assignee: General DataComm, Inc., Middlebury, Conn.

[21] Appl. No.: 7,717

[22] Filed: Jan. 28, 1987

Related U.S. Application Data

[62] Division of Ser. No. 822,396, Jan. 27, 1986.

[51] Int. Cl.$^4$ .............................................. H03M 1/44
[52] U.S. Cl. ............................ 340/347 AD; 323/315; 323/316; 330/257; 330/260; 340/347 M
[58] Field of Search .......... 340/347 A, 347 M, 347 C, 340/347 NT, 347 CC; 330/257, 260, 268; 323/315, 316

[56] References Cited

U.S. PATENT DOCUMENTS 4,513,178  4/1985  Hing et al. ...................... 323/316 X Primary Examiner—T. J. Sloyan
Attorney, Agent, or Firm—David P. Gordon

[57] ABSTRACT

An apparatus for converting an input voltage into a related output current, is disclosed and generally comprises: a resistance means in series with the voltage input; first and second double output current mirrors, wherein each output of the first double output mirror is connected to a corresponding output of the second double output mirror, and the inputs of the double output current mirrors are connected; and an operational amplifier with the inverting input connected to ground, the noninverting input connected to the resistance means, and the op amp output connected to the inputs of the first and second double output mirrors, wherein first outputs of the first and second double output mirrors are connected to the noninverting input of the operational amplifier, and the second outputs of the first and second double output mirrors are connected to the output current. The disclosed transconductance amplifier is advantageously used to transform an input voltage into an input current for a continuous time analog to digital converter which uses current steering techniques.

6 Claims, 3 Drawing Figures 4,689,607

BIDIRECTIONAL TRANSCONDUCTANCE AMPLIFIER

A divisional application of Ser. No. 822,396 filed Jan. 27, 1986, which is hereby incorporated by reference herein.

BACKGROUND

The present invention relates to an apparatus for converting a voltage signal into a current signal. The invention more particularly relates to a stable, wideband, bidirectional transconductance amplifier for converting a voltage signal into a current signal which may be advantageously employed in a continuous time domain analog to digital converter.

Transconductance amplifiers are well known in the art. One known transconductance amplifier comprises an operational amplifier with its non-inverting input at the input voltage, its inverting input being connected to the source of a MOS transistor, its output being connected to the gate of the same MOS transistor, and the source of the transistor being connected to ground via a resistor. While such an arrangement is stable over a wide bandwidth, and the output node is at ground, the arrangement is unidirectional as the transistor only allows current to flow in a single direction.

A second transconductance amplifier known in the art an operational amplifier with four matched resistors. The input voltage is connected to the inverting input via a first resistor. The non-inverting input is connected to ground via a second resistor. A third resistor bridges the output and the inverting input of the op amp. A sense resistor (unmatched) is located in series between the op amp output and the output of the transconductance amplifier, and a fourth matched resistor bridges the transconductance amplifier output and the non-inverting input to the operational amplifier. While the provided output current is equal to the input voltage divided by the resistance of the fourth resistor and is thus bidirectional, the arrangement is unstable and is useful only over a limited bandwidth.

SUMMARY OF THE INVENTION

It is therefore an object of the invention to provide a transconductance amplifier for converting voltage signals into current signals which is bidirectional, and stable over a wide band-width.

It is a further object of the invention to provide a bidirectional transconductance amplifier which is readily integrated and may be advantageously used in a continuous parallel successive rectification analog to digital converter using current steering techniques.

In accord with the objects of the invention, a transconductance amplifier is provided and comprises:

(a) a resistance means in series with a voltage input;

(b) first and second double output current mirrors, wherein each output of the first double output mirror is connected to a corresponding output of said second double output mirror, and the inputs are connected;

(c) an operational amplifier with the inverting input connected to ground, the noninverting input connected to said resistance means, and the op amp output connected to the inputs of said first and second double output mirrors, wherein first outputs of said first and second double ouput mirrors output are connected to said noninverting input of said operational amplifier, and the second outputs of said first and second double output mirrors output is connected to said $I_{out}$.

According to another aspect of the invention, the transconductance amplifier is used with an analog to digital converter using current steering techniques. Because an analog voltage is tyically supplied rather than a current, the analog to digital converter tyically requires the use of the transconductance amplifiers of the invention to provide an $I_{in}$. The continuous time parallel successive rectification converter for converting an analog signal into digital form comprises:

(a) a plurality of stages for performing the conversion algorithm $I_{out} = 2|I_{in}| - I_{ref}$, wherein $I_{in}$ is the current to the input of a particular stage, $I_{out}$ is the current at the output of that stage which becomes the $I_{in}$ to the next stage, and $I_{ref}$ is a chosen reference current, each stage comprising (i) a current rectifier comprising a p-channel transistor and an n-channel transistor having common gates connected to ground and common sources connected to $I_{in}$, a first current mirror with its input connected to the drain of said n-channel transistor, and its output connected to at least the drain of said p-channel transistor, and a second current mirror with the drain of said p-channel transistor as an input and $I_{out}$ as an output, (ii) a third current mirror with said $I_{ref}$ as an input and said $I_{out}$ as an output, wherein said second current mirror of said current rectifier has a gain of two, the analog signal converted by said apparatus is related to the $I_{in}$ current into the first stage of said apparatus, and a bit of information is obtained from the direction of the current flow of each $I_{in}$, the output bit of each stage together forming a Gray code output word.

Preferably, the second current mirror obtains a gain of two by arranging the transistors on the output side of said current mirror to be twice the width of the corresponding transistors of the input side of said current mirror. Also, if desired, means for converting said Gray code output word into a binary code output word are provided. Typically such means comprises exclusive OR or NOR gates. It should also be recognized that the analog signal which is to be converted into digital format is "related" to the $I_{in}$ to the first stage of the converter in that the analog signal is a voltage signal analagous thereto which is converted into the $I_{in}$ signal via the use of the transconductance amplifier invention. Likewise, the $I_{ref}$ signal is obtained by converting a $V_{ref}$ signal into the current signal through the use of a transconductance amplifier of the invention.

A better understanding of the invention, and additional advantages and objects of the invention will become apparent to those skilled in the art upon reference to the detailed description and the accompanying drawings.

BRIEF DESCRIPTION OF THE DRAWINGS

FIG. 2B is a diagram defining the direction and polarity of current flow for the continuous converter of FIG. 2a.

DETAILED DESCRIPTION OF THE PREFERRED EMBODIMENT

Figure 1:
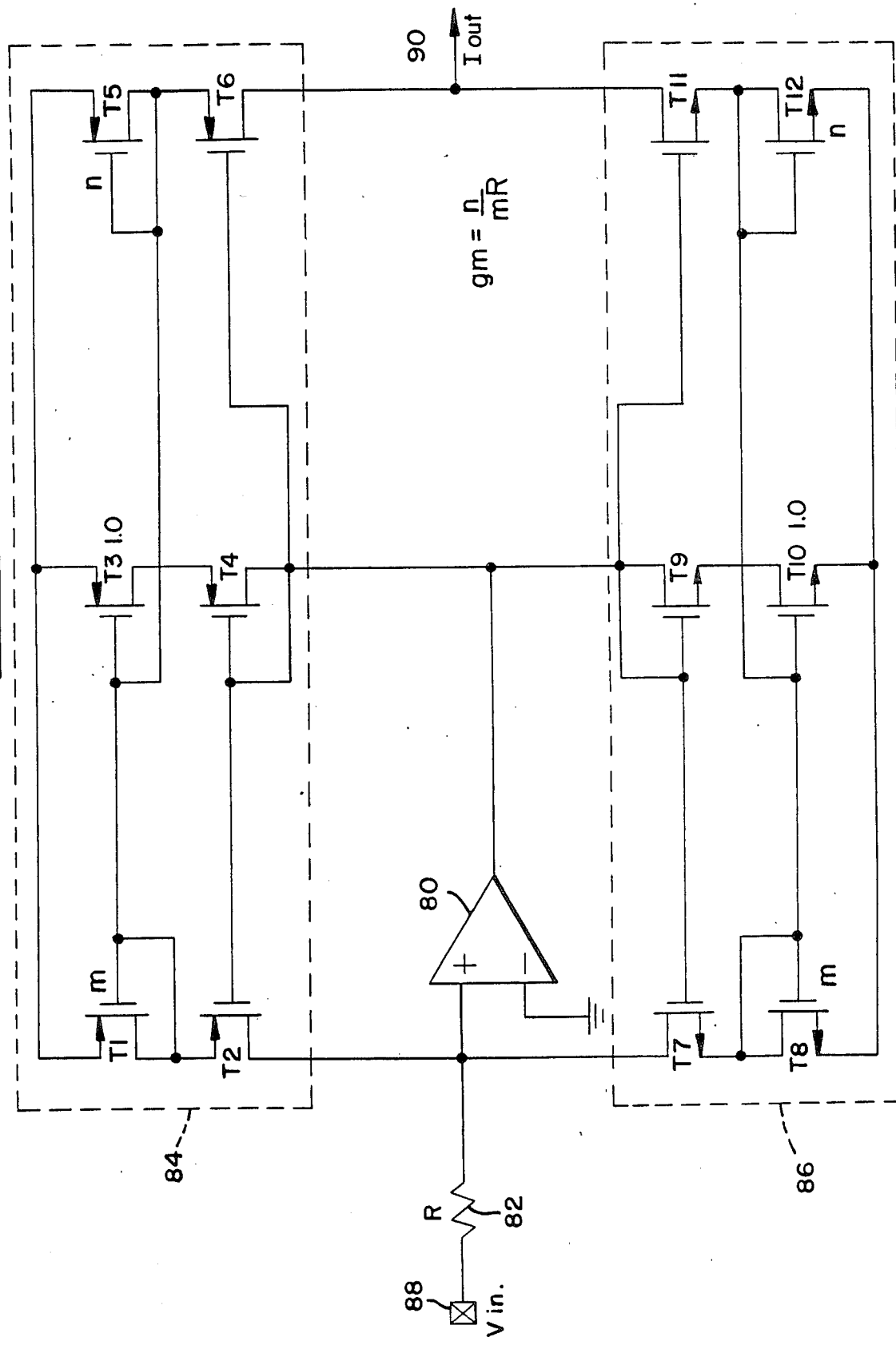
FIG. 1 is a schematic of the transconductance amplifier used in converting voltages to currents preferably for use with a continuous time analog-digital converter.

Turning to FIG. 1, the preferred transconductance amplifier which may be used with a continuous time successive rectification A-D converter hereinafter described is seen. The transconductance amplifier generally comprises an op amp 80, a resistor 82, and two double output current mirrors 84 and 86. The resistor 82 is connected in series between the voltage input $V_{in}$ 88 and the noninverting input of the operational amplifier 80. The inverting input of the op amp 80 is connected to ground. The output of the op amp 80 is connected to and acts as the input of the double output current mirrors 84 and 86. A first double output current mirror comprises p-channel FETs T1, T2, T3, T4, T5, and T6, with FETs T1, T3, and T5 having connected or common gates and connected or common sources, and FETs T2, T4, and T6 having connected or common gates. FETs T1, T4 and T5 are shorted with their gates being connected to their drains. The drains of FETs T1, T3, an T5 are respectively connected to the sources of FETs T2, T4, and T6. The sources of FETs T2 and T6 (the outputs) are respectively connected to the noninverting input of op amp 80 and a node from which $I_{out}$ 90 is taken, with the source of FET T4 (the input) connected to the output of omp amp 80.

Second double output current mirror 86 comprises n-channel FETs T7, T8, T9, T10, T11, and T12. FETs T8, T10, and T12 have connected or common sources and gates, with FETs T8 and T12 being shorted by having their gates connected to their drains. The drains of FETs T8, T10, and T12 are respectively connected to the sources of FETs T7, T9, and T11 which have common or connected gates. FET T9 is shorted with its gate being connected to its drain. The drains of FETs T7, T9, and T11 are respectively connected to the drains of FETs T2, T4, and T6.

In operation, the input voltage 88 causes a current to flow through resistance means 82, and also causes a voltage to appear at the noninverting input to amplifier 80. For purposes of example, if the input voltage was of positive polarity, the response of the op amp 80 would be to increase the output voltage of the op amp 80. A higher voltage at the ouput would cause an increased current flow in FETs T9 and T10, and a decreased flow in FETs T3 and T4 if a constant voltage difference is maintained between the sources of FETs T1, T3, and T5, and the sources of FETs T8, T10, and T12. Because FET T9 is the input into the double output current mirror 86, the current flow through FETs T9 and T10 will cause twin flows to occur both in FETs T7 and T8, and T11 and T12. The exact ratio of the flow will depend on the relative channel widths of FETs T10, T8 and T12. As shown in FIG. 6, the ratio of current flow in FETs T8, T10, and T12 will be m:1:n. Likewise, because FET T4 is the input to double output current mirror 84, the current flow through FETs T3 and T4 will cause twin flows to occur both in FETs T1 and T2, and T5 and T6. Because the ratio of the widths of T1, T3, and T5 is arranged to correspond to the ratio of the widths of T8, T10, and T12, the ratio of the current flow through FETs T1, T3, and T5 is m:1:n.

Those skilled in the art will understand that the resulting current $I_{out}$ 90 from the transconductance amplifier as described will be the difference of the current flowing into FETs T6 and T11. The total current $I_{out}$ according to the invention is equal to $V_{in}(n/mR)$, where the transconductance $g_m$ is defined as $n/mR$.

Figure 2B:
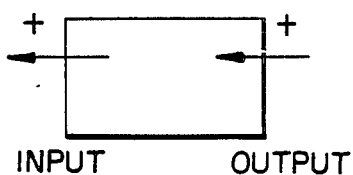
Figure 2A:
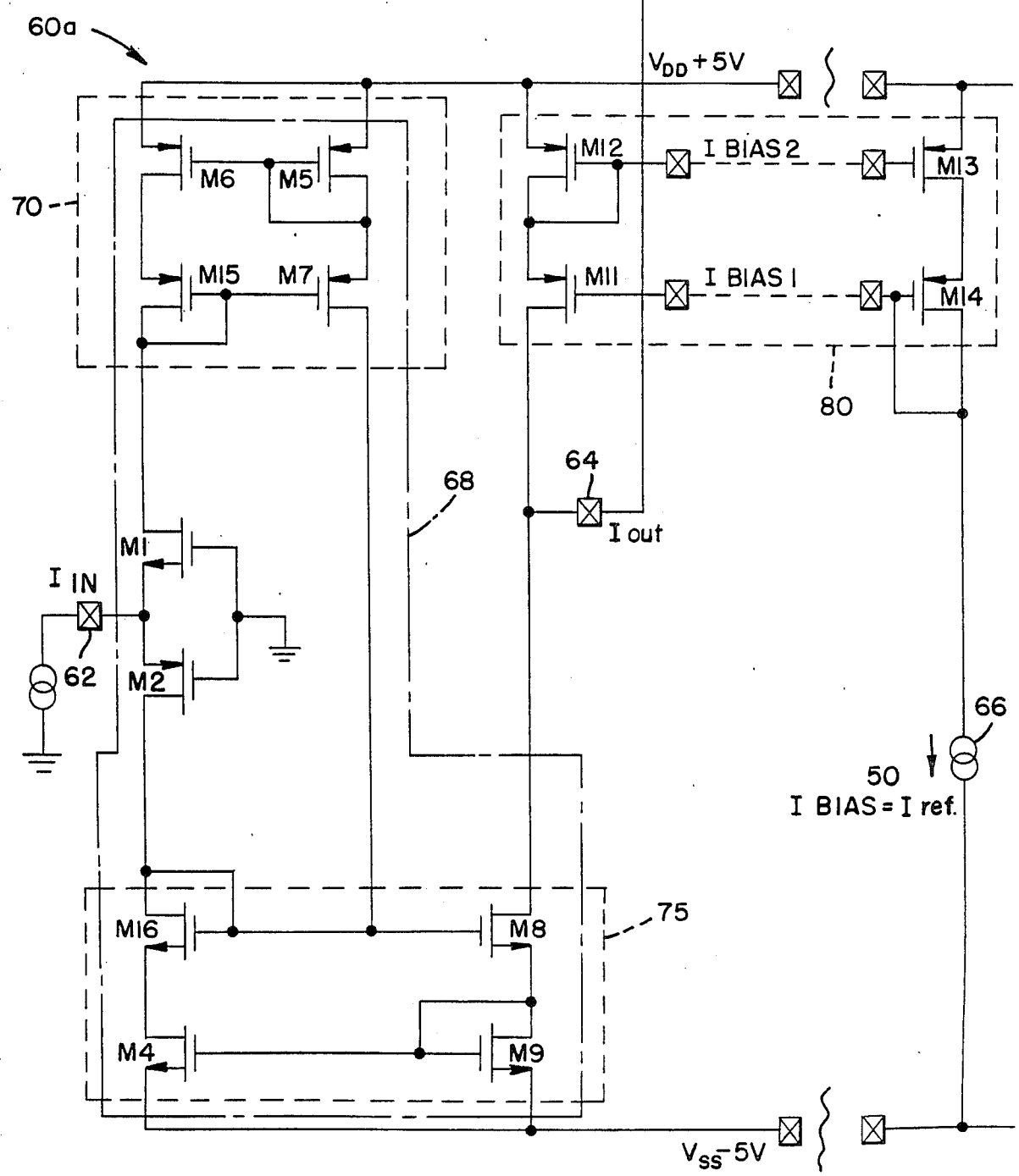
FIG. 2A is a part block diagram part schematic of a parallel continuous successive rectification analog to digital converter requiring an input current and the circuitry of one stage of the continuous converter.

Turning to FIG. 2A, a continuous time embodiment of a successive rectification A-D converter is shown implemented with MOSFETs. FIG. 2A should be understood with reference to FIG. 2B which defines the direction and polarity of current flow. Thus, a current flow out of the input will be considered to be a positive current (providing a negative voltage), while a current flow into the output will also be considered a positive current.

As seen in FIG. 2A, the continuous time embodiment requires an input current $I_{in}$ and a reference current $I_{ref}$. As only input and reference voltages are typically available, the transconductance amplifier of the invention described above is preferably used for converting input and reference voltages into currents.

The continuous time analog to digital converter implements the successive rectification algorithm of the art (which is discussed in parent application Ser. No. 822,396 filed Jan. 27, 1986), except that voltages are changed into currents. Thus, a plurality of stages 60a, 60b, . . . for performing the conversion algorithm $I_{out}=2|I_{in}|-I_{ref}$ are provided wherein $I_{in}$ 62 is the current at the input of a particular stage, $I_{out}$ 64 is the current at the output of that stage which becomes the $I_{in}$ of the next stage, and $I_{ref}$ 66 is a chosen reference current.

In order to provide a rectified input current, a current rectifier 68 is provided and essentially comprises: a complementary transistor pair having an n-channel FET M1 and a p-channel FET M2 with common gates connected to ground, common sources connected to the source of $I_{in}$ 62; a first current mirror 70 having p-channel FETs M6, M15, M5 and M7, with the input connected to the drain of said p-channel FET M1, and the output connected to at least the drain of said n-channel FET M2; and a second FET current mirror 75 having n-channel FETs M16, M4, M8, and M9, with the drain of p-channel FET M2 as the input, and current flowing from $I_{out}$ 64 as the output. Those skilled in the art will appreciate that this arrangement provides an offset-free current rectifier.

The amplification of the $I_{in}$ current by a factor of two is accomplished in the second FET current mirror 75 by having the widths of the mirror FETs M8 and M9 being twice the widths of their corresponding FETs M16 and M4.

A third FET current mirror 80 comprising p-channel FETs M11, M12, M13, and M14 is used to complete the algorithm by subtracting the $I_{ref}$ current 66 from $I_{out}$ 64. Thus, $I_{ref}$ 66 (which may be derived by processing $V_{ref}$ with the transconductance amplifier of the invention) serves as the current mirror input and is connected to the drain of FET M14. In turn a mirror current is provided at the drain of FET M11, and that output is connected to $I_{out}$ 64. With the current rectifier, amplifier, and subtractor so arranged, the input current is processed and leaves stage 60a according to the algorithm $I_{out}=2|I_{in}|-I_{ref}$. The output of one stage then becomes the input to the successive stage.

In operation, a $V_{in}$ such as seen at 88 of FIG. 1 is transformed by the transconductance amplifier of FIG. 1 into an $I_{out}$ 90. That $I_{out}$ 90 of FIG. 1 is taken as the $I_{in}$ 62 current into FIG. 2A. A first bit of information is derived from the direction of the flow of current $I_{in}$ 62. If current is flowing out (positive flow) of the circuitry toward the current source (transconductance amplifier of FIG. 1), the provided voltage may be assumed to be negative as the gate of M1 is at ground. Current flowing into stage 60a (negative flow) may be considered evidence of a positive voltage. With the sources of FETs M6, M5, and M12 at a positive supply potential, and the sources of FETs M4 and M9 at a negative supply potential, if the current is flowing negatively at stage 60a, it must necessarily follow a path through FETs M2, M16, and M4, as FET M1 will not allow current to flow through it in that direction. As a result of that flow, FETs M8 and M9, which complete the second current mirror 75, provide a twin current which mirrors FETs M16 and M4. However, because FETs M8 and M9 are arranged to have twice the widths of FETs M16 and M4, the current flowing through FETs M8 and M9 is twice that of the current $I_{in}$ flowing through FETs M16 and M4.

If the current is flowing positively (out of) at stage 60a, the current must necessarily be coming from FETs M6, M15, and M1, as FET M2 will not permit current to flow through it in such a direction. As a result of the current flowing through FETs M6 and M15, an equal current flows through FETs M5 and M7, as FETs M5 and M7 complete the first current mirror 70. Current leaving the drain of FET M7 continues through the drain of FET M16 because of the gate-drain short of FET M16 and then continues through FET M4. The flow of current through FETs M16 and M4 cause a flow through FETs M8 and M9 of twice the $I_{in}$ current, as previously described, because FETs M8 and M9 complete second current mirror 75 and because FETs M8 and M9 are twice the width of FETs M16 and M4. Thus, it is seen that the combination of the complementary transistor pair M1 and M2 with first current mirror 70 and second current mirror 75, acts to rectify the current signal, as the current magnitude dictated by $I_{in}$ will always flow in the same direction through FETs M8 and M9. Because the current is "supplied" by $I_{out}$, the current due to $2|V_{in}|$ will always flow positively from the input of stage 60b, and will always be positively rectified. It is also seen that the input current signal may be amplified by a factor of two by causing the transistors on the mirror side of the second current mirror 75 to be twice the width of the corresponding transistors on the input side.

The operation of the final aspect of the successive rectification algorithm is seen by referring to $I_{ref}$ 66 (derived through a $V_{ref}$ and the transconductance amplifier of FIG. 1) and third current mirror 80. By choosing $I_{ref}$ to be a current in a defined direction, the $I_{ref}$ current is forced to flow down through FETs M13 and M14. The current flow through FETs M13 and M14 causes an identical current to flow through FETs M12 and M11, the mirror FETs of current mirror 80. Thus, current $I_{ref}$, by definition, flows negatively at $I_{out}$, in the opposite direction of the current $(2|I_{in}|)$ flowing through FETs M8 and M9, and completes the operation. As the $I_{out}$ of stage 60a is the $I_{in}$ of stage 60b, a second bit of information may be determined by determining the direction of the flow of current at the input to stage 60b. Indeed, as aforementioned, if the current is flowing out of stage 60b (positive flow), the voltage will be measured as a negative voltage as the gate of the M1 FET of stage 60b is at ground. Conversely, current flowing into stage 60b will be provide a positive voltage measurement.

The output of the stages provides information in a Gray code. The Gray code may be converted into binary information by processing it through exclusive NOR gates.

Those skilled in the art will appreciate that the continuous parallel successive rectification A-D converter is extremely fast in providing as many bits of resolution as is required because it uses current steering techniques. Indeed, it is therefore aptly described as a continuous converter as no switches are required for timing. It is also extremely energy efficient as the FETs of the embodiment use very little power. Thus, a continuous time parallel successive rectification A-D converter modelled according to the teachings of the invention was able to provide six bits of resolution in 290 nanoseconds, and twelve bits of resolution in 580 nanoseconds. The wattage per stage was approximately 0.5 milliwatts. However, the transconductance amplifiers used to convert the reference and sampled voltages into currents utilized 192 milliwatts. It should be recognized that such an overall performance permits the realization of the transconductance amplifier and analog to digital converter in microchips and integrated circuits, and permits the employment of the both in a wide range of devices There has been described and illustrated herein an apparatus for converting a voltage into a corresponding current which is particularly useful in a described analog to digital converter. While particular embodiments of the invention have been described, it is not intended that the invention be limited thereby, as it is intended that the invention be broad in scope and that the specifications be read likewise. For example, while the transconductance amplifier was described as using double current mirrors each having six transistors, different double current mirrors using three, five, or other amounts of transistors could be effectively used.

It should also be recognized that the transconductance amplifier of the invention may be realized in many different forms. For example, discrete components may be used for each of the describe devices. Or, if desired, the components may be partially or fully integrated into an integrated circuit. Finally, if desired, equivalent componentry may be substituted with only minor resulting changes in the designs and results. Thus, for example, the MOSFETs used and described could be replaced by bipolar transistors and resistors, if desired, and it is intended that the invention encompass such minor changes. Indeed, it is intended that the terminology relating to the transistors be used in a broad sense, with "source" being generic for a source or emitter, "gate" being generic for a gate or base, etc. Therefore, it will be apparent to those skilled in the art that other changes and modifications may be made to the invention as described in the specification without departing from the spirit and scope of the invention as claimed.

I claim:

1. An apparatus for converting an input voltage into a related output current, comprising:
   (a) a resistance means in series with said voltage input;
   (b) first and second double output current mirrors, wherein each output of said first double output mirror is connected to a corresponding output of said second double output mirror, and the inputs of said double output current mirrors are connected;
   (c) an operational amplifier with an inverting input connected to ground, a noninverting input connected to said resistance means, and an op amp output connected to the inputs of said first and second double output mirrors, wherein first outputs of said first and second double output mirrors are connected to said noninverting input of said operational amplifier, and the second outputs of said first and second double output mirrors are connected to said output current.

2. An apparatus according to claim 1, wherein:

said resistance means has a resistance of R;

said first and second double output current mirrors are comprise of a plurality of transistors, the relative widths of the transistors of the first outputs, to the inputs, to the second outputs being m:l:n; and the transconductance of said apparatus is given by n/mR.

3. An apparatus according to claim 2, wherein:

said first and second double output current mirrors are comprised of at least three transistors.

4. An apparatus according to claim 3, wherein:

said first and second double output current mirrors are comprised of six transistors.

5. In an apparatus for the analog to digital conversion of an input signal, said input signal being a voltage signal, the apparatus having a plurality of stages for performing the conversion algorithm $I_{out}=2|I_{in}|-I_{ref}$, wherein $I_{in}$ is the current at the input of a particular stage, $I_{out}$ is the current at the output of that stage which becomes the $I_{in}$ to the next stage, and $I_{ref}$ is a chosen reference current, with each stage of the analog to digital converter apparatus comprising a current rectifier, at least one current mirror having a gain of 2, and a current mirror with said $I_{ref}$ as an input and said $I_{out}$ as an output, a transconductance amplifier for taking said input voltage signal and changing it into a related current signal $I_{in}$, said transconductance amplifier comprising:

(a) a resistance means in series with said voltage signal input;

(b) first and second double output current mirrors, wherein each output of said first double output mirror is connected to a corresponding output of said second double output mirror, and the inputs of said double output current mirrors are connected;

(c) an operational amplifier with the inverting input connected to ground, the noninverting input connected to said resistance means, and the op amp output connected to the inputs of said first and second double output mirrors, wherein first outputs of said first and second double output mirrors are connected to said noninverting input of said operational amplifier, and the second outputs of said first and second double output mirrors are connected to said output current.

6. An apparatus according to claim 5, wherein in said transconductance amplifier:

said resistance means has a resistance of R;

said first and second double output current mirrors are comprised of a plurality of transistors, the relative widths of the transistors of the first outputs, to the inputs, to the second outputs being m:l:n; and the transconductance of said apparatus is given by n/mR.

* * * * *